United States Patent
Ham et al.

(10) Patent No.: US 7,151,589 B2
(45) Date of Patent: Dec. 19, 2006

(54) LITHOGRAPHIC APPARATUS AND PATTERNING DEVICE TRANSPORT

(75) Inventors: Erik Leonardus Ham, Rotterdam (NL); Gert-Jan Heerens, Schoonhoven (NL); Robert Gabriël Maria Lansbergen, Schiedam (NL); Ellard Alexander Meijer, Haarlem (NL); Hendricus Johannes Maria Meijer, Veldhoven (NL); Hans Meiling, Waalre (NL); Bastiaan Matthias Mertens, 's-Gravenhage (NL); Johannes Hubertus Josephina Moors, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 199 days.

(21) Appl. No.: 10/972,755

(22) Filed: Oct. 26, 2004

(65) Prior Publication Data

US 2005/0286029 A1 Dec. 29, 2005

Related U.S. Application Data

(63) Continuation-in-part of application No. 10/874,690, filed on Jun. 24, 2004.

(51) Int. Cl.
*G03B 27/32* (2006.01)
*G03B 27/52* (2006.01)

(52) U.S. Cl. .......................................... 355/30; 355/77
(58) Field of Classification Search .................. 355/30, 355/53, 75, 77; 206/710; 414/217; 55/356
See application file for complete search history.

(56) References Cited

U.S. PATENT DOCUMENTS

| | | | | |
|---|---|---|---|---|
| 6,863,733 | B1* | 3/2005 | Tanabe | 118/722 |
| 2003/0021671 | A1* | 1/2003 | Edo | 414/939 |
| 2003/0049101 | A1* | 3/2003 | Seita | 414/217 |
| 2005/0002003 | A1* | 1/2005 | Hoogkamp et al. | 355/30 |

* cited by examiner

*Primary Examiner*—Rodney Fuller
(74) *Attorney, Agent, or Firm*—Pillsbury Winthrop Shaw Pittman, LLP

(57) ABSTRACT

According to an embodiment, a box for transporting a lithographic patterning device is arranged to cooperate with a lithographic apparatus. The transport box may be provided with a container part having an inner space with a storing position for storing the patterning device and an opening for the transfer of the patterning device. Prior to transfer of the patterning device from the inner space to the apparatus, the inner space is pressurized. The box may also comprise a closure part for closing the opening, and/or a channel system for evacuating and/or feeding gasses from/to the inner space of the box. Other embodiments include a lithographic apparatus comprising and/or configured to cooperate with such a box.

32 Claims, 8 Drawing Sheets

LITHOGRAPHIC APPARATUS AND PATTERNING DEVICE TRANSPORT

PRIORITY INFORMATION

This application claims benefit of and is a Continuation-In-Part of U.S. patent application Ser. No. 10/874,690, filed on Jun. 24, 2004, entitled "Lithographic Apparatus and Patterning Device Transport." The content of that Application is incorporated herein in its entirety by reference.

BACKGROUND

1. Field of the Invention

The present invention relates to lithographic apparatus, equipment, and methods.

2. Description of Related Art

A lithographic apparatus is a machine that applies a desired pattern onto a target portion of a substrate. Lithographic apparatus can be used, for example, in the manufacture of integrated circuits (ICs). In that circumstance, a lithographic patterning device, which is alternatively referred to as a "mask" or "reticle," may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (i.e., resist).

In general, a single substrate will contain a network of adjacent target portions that are successively exposed. Known lithographic apparatus include so-called steppers, in which each target portion is irradiated by exposing an entire pattern onto the target portion in one go, while in so-called scanners, each target portion is irradiated by scanning the pattern through the projection beam in a given direction (the "scanning"-direction) while synchronously scanning the substrate parallel or anti-parallel to this direction.

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning means include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

Generally, such patterning devices are transported from one location to another via a transport box, which are readily known and widely used. The transportation can take place between a stock of patterning devices and a lithographic apparatus. When the patterning devices are located inside the box, transportation is possible while the patterning devices are protected against outside contamination (e.g., organic contamination, Si-particles, metal particles, chemical contamination, molecular contamination, dust particles, etc.).

After transportation, the patterning devices can be transferred from the box to the lithographic apparatus. Afterwards, further transportation is performed by a pick and place machine (i.e., placing equipment) to a reticle stage/table/holder that holds the patterning device while an exposure beam of radiation exposes substrates or wafers.

According to a conventional method of exchanging patterning devices, the transport box loaded with the patterning device is coupled to the lithographic apparatus. The coupling is facilitated by an arrangement in which a door of the box, carrying the patterning device, is coupled to a door of the lithographic apparatus that is, in turn, coupled to an elevator mechanism. After the coupling, the elevator with the doors is lowered and the patterning device enters the lithographic apparatus for further transport into the reticle stage.

SUMMARY

Embodiments of the invention include a method of transferring a patterning device from a box to a lithographic apparatus, which method includes pressurizing an inner space of the box in which the patterning device is located to obtain a first gas pressure in the inner space; subsequent to the pressurizing, coupling the inner space of the box to an inner space of the lithographic apparatus, the inner space of the lithographic apparatus being under a second gas pressure of about 1 bar; and transferring the patterning device from the inner space of the box to the inner space of the lithographic apparatus, wherein the first gas pressure is greater than the second gas pressure.

A lithographic apparatus in accordance with an embodiment of the invention includes an illumination system configured to condition a beam of radiation; a support structure configured to support a patterning device, the patterning device being configured to impart a desired pattern to the beam of radiation; a substrate holder configured to hold a substrate; a projection system configured to project the patterned beam of radiation onto a target portion of the substrate; a pressure unit configured to pressurize an inner space of a box in which the patterning device is located to obtain a first gas pressure in the inner space; and a transfer assembly configured to transfer the patterning device from the inner space of said box to an inner space of said lithographic apparatus, the inner space of the lithographic apparatus being under a second gas pressure of about 1 bar, wherein the first gas pressure is greater than said second gas pressure.

In an embodiment of the invention, there is provided a machine readable medium encoded with machine executable instructions for transferring a patterning device from a box to a lithographic apparatus, according to a method including pressurizing an inner space of the box in which the patterning device is located to obtain a first gas pressure in the inner space; subsequent to the pressurizing, coupling the inner space of the box to an inner space of the lithographic apparatus, the inner space of the lithographic being under a second gas pressure of about 1 bar; and transferring the patterning device from the inner space of the box to the inner space of the lithographic apparatus, wherein the first gas pressure is greater than the second gas pressure and wherein the connected inner spaces are substantially gas-tight sealed from an external environment.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
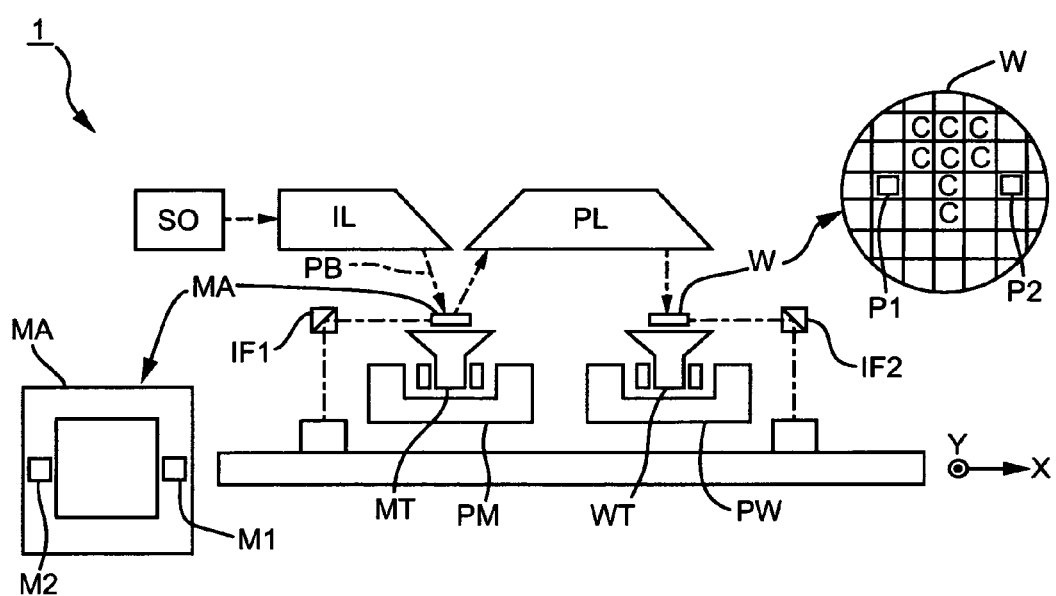
FIG. 1 depicts a lithographic apparatus according to an embodiment of the invention.

FIG. 1 schematically depicts a lithographic apparatus 1 according to an embodiment of the invention. The apparatus 1 comprises:
- an illumination system (illuminator) IL: for providing a projection beam PB of radiation (e.g., UV or EUV radiation).
- a first support structure (e.g., a mask table/holder) MT: for supporting patterning device (e.g., a mask) MA and coupled to first positioning mechanism PM for accurately positioning the patterning device with respect to item PL;
- a substrate table (e.g., a wafer table/holder) WT: for holding a substrate (e.g., a resist-coated wafer) W and coupled to second positioning mechanism PW for accurately positioning the substrate with respect to item PL; and
- a projection system (e.g., a reflective projection lens) PL: for imaging a pattern imparted to the projection beam PB by patterning device MA onto a target portion C (e.g., comprising one or more dies) of the substrate W.

As here depicted, the apparatus is of a reflective type (e.g., employing a reflective mask or a programmable mirror array of a type as referred to above). Alternatively, the apparatus may be of a transmissive type (e.g., employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise adjusting mechanism for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning mechanism PW and position sensor IF2 (e.g., an interferometric device), the substrate table WT can be moved accurately, e.g., so as to position different target portions C in the path of the beam PB. Similarly, the first positioning mechanism PM and position sensor IF 1 can be used to accurately position the mask MA with respect to the path of the beam PB, e.g., after mechanical retrieval from a mask library, or during a scan. In general, movement of the object tables MT and WT will be realized with the aid of a long-stroke module and a short-stroke module, which form part of the positioning mechanism PM and PW. However, in the case of a stepper (as opposed to a scanner) the mask table MT may be coupled to a short stroke actuator only, or may be fixed. Mask MA and substrate W may be aligned using mask alignment marks M1, M2 and substrate alignment marks P1, P2.

The depicted apparatus can be used in the following preferred modes:
- step mode: the mask table MT and the substrate table WT are kept essentially stationary, while an entire pattern imparted to the projection beam is projected onto a target portion C in one go (i.e., a single static exposure). The substrate table WT is then shifted in the X and/or Y direction so that a different target portion C can be exposed. In step mode, the maximum size of the exposure field limits the size of the target portion C imaged in a single static exposure.
- scan mode: the mask table MT and the substrate table WT are scanned synchronously while a pattern imparted to the projection beam is projected onto a target portion C (i.e., a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
- other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The lithographic apparatus 1 (FIG. 1, FIG. 2A, FIG. 2B) is to be provided with patterning device MA, 4 containing the lithographic pattern to be exposed onto the wafer W. The transport box 2 can be used for transportation of lithographic patterning device MA, 4. Examples of patterning devices are EUV masks or EUV reticles. The transport box 2 can hold one or more reticle(s) (e.g., a number of vertically-stacked reticles). The patterning devices MA, 4 are protected by the box against contamination such as organic, chemical, and/or molecular contamination.

For Extreme Ultraviolet (EUV) applications there are disadvantages in applying a pellicle. A pellicle is a transparent member that can be placed on the patterning device (on the pattern) in order to keep possible contamination at distance from the pattern present on the patterning device. The application of such a pellicle is avoided for EUV applications (e.g. because no suitable materials are currently known to be sufficiently transparent at EUV wavelengths). The absence of the pellicle implicates that extra measures have to be applied which reduce the presence and risks of contamination particles on the patterning device. An important measure is that the patterning devices are transported to the lithographic apparatus 1 in the box 2 in such a way that the patterning device MA, 4 are not contaminated during transport.

In this example, the transport box 2 (see, FIGS. 2A, 2B) has the form of a block (i.e., rectangular cross-section), although it will be appreciated that other forms, such as, for example, pill-forms, cylindrical forms, are also possible. The box 2 can be made of many kinds of metals, synthetic materials or combinations thereof. Possible choices of metals are aluminum and titanium. In this example, the construction is such that it can resist a maximum expected pressure differential with a sufficient degree of stiffness.

Figure 2A:
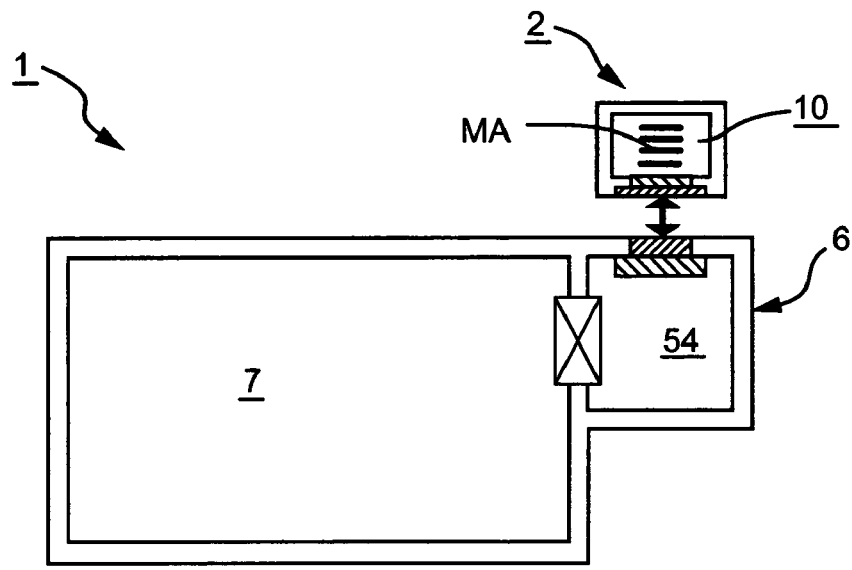
FIG. 2A is a schematic side view of a box according to the invention and a lithographic apparatus provided with a load lock according to the invention.

FIG. 2A depicts a configuration, in accordance with an embodiment of the present invention, comprising a box 2 that is capable of cooperating with a load lock 6 of the lithographic apparatus 1 for transferring or exchanging the patterning device MA, 4. The box 2 can hold one or more masks or reticles. In this example, the patterning device can be transported from the box 2 into the further inner space 7 of the lithographic apparatus 1 via the load lock 6.

Figure 2B:
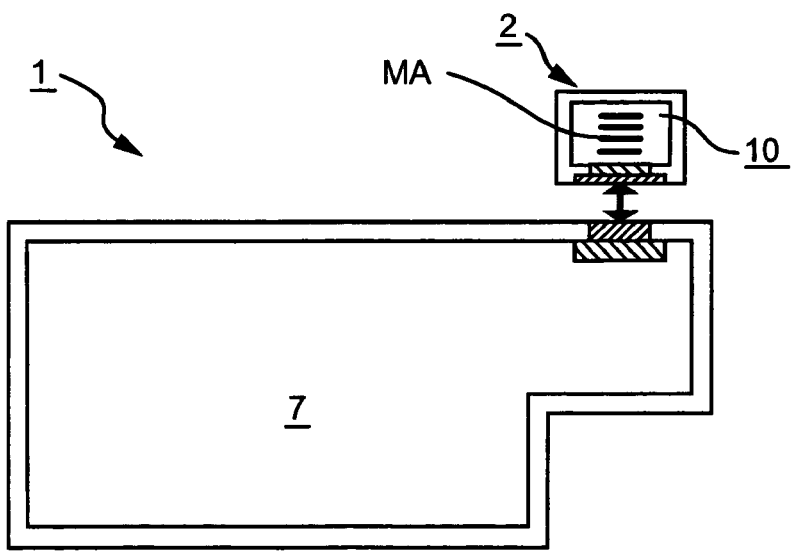
FIG. 2B is a schematic side view of a box according to the invention and a lithographic apparatus according to the invention.

FIG. 2B provides another configuration, in accordance with an embodiment of the present invention, comprising a box 2 that cooperates with the lithographic apparatus 1 without a load lock. Although, such a configuration works well, the previous configuration (see, FIG. 2A) may be preferred because it offers an advanced pressurized feedthrough of the patterning device MA, 4 via the lock 6 into the further inner space 7 of the lithographic with enhanced protection against contamination. The further inner space 7 may encompass the area where the exposure-related components of the lithographic apparatus 1 are located, such as, for example, projection system, substrate holder/table, etc.

(see discussion above). Typical volumes for the spaces can be the following: $10^{-4}$ m$^3$ of the inner space of the transport box; $10^{-2}$ m$^3$ of the inner space of the load lock 6; and 5 m$^3$ of the further inner space 7 of the lithographic apparatus.

Figure 3A:
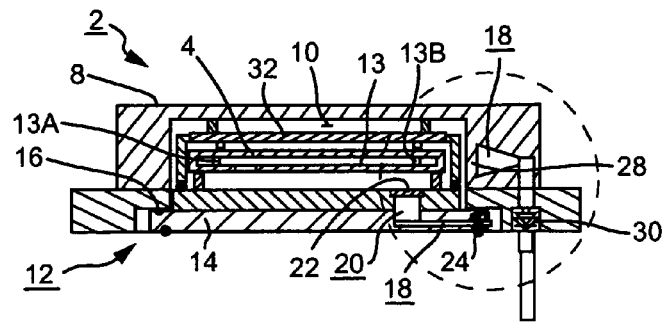
FIG. 3A is a schematic side view of a vertical oriented cross section of a box according to the invention, wherein the box comprises patterning device.

Hereafter, the configuration according to FIG. 2A will be explained in more detail. As shown in FIG. 3A, the transport box 2 is provided with a container part 8 having an inner space 10 for storing the patterning device 4 in a storing position and an opening 12 for transferring/exchanging the patterning device 4. The box 2 also comprises a closure part 14 for closing the opening 12. In this example the opening is at the bottom side, but it will be appreciated that a front side opening or an opening at the upper side can also be applied. The patterning devices 4 are held by a table 13 provided with carrying pins 13A, 13B for carrying the patterning device 4. As such, the carrying pins 13A, 13B define the storage position.

Figure 3B:
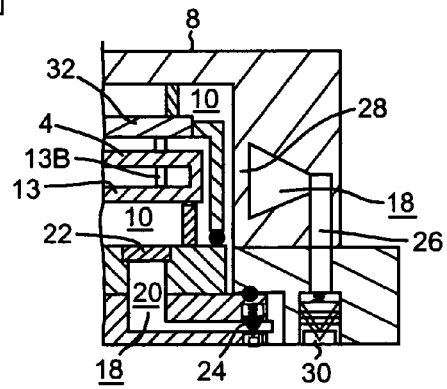
FIG. 3B is a detailed view of a portion of FIG. 3A.

As shown in FIG. 3A, the transport box 2 is provided with a gastight seal 16 located between the container part 8 and the closure part 14. The gastight seal 16 can be a resilient member which fits in a recess or recesses of the container part 8 and/or the closure part 14. The box 2 is provided with a channel system 18 for evacuating gasses from the inner space 10 and/or for venting gasses into the inner space 10. (It is understood that the term "evacuating" as used in this document encompasses any reducing of the pressure within a space.) The channel system 18 is indicated clearly in FIG. 3B.

How the channel system 18 is used with respect to the transport box 2 in cooperation with the load lock 6 in transporting the patterning device 4 to and from the further inner space 7 (i.e., where the exposure-related components are located) of the lithographic system 1, will be explained in greater detail below.

The channel system 18 of the transport box 2 comprises an output channel 20 connected to the inner space 10. The output channel 20 can be connected with an external evacuating device for evacuating gas from the inner space 10. The external evacuating device can be part of a gas pressure unit that is configured to adjust the gas pressure of the inner space. Thus, the box 2 can be pumped into a vacuum condition. In this example, the output channel 20 is provided with a particle filter 22 for preventing the inner space 10 from being contaminated with particles via the output channel 20. It is noted that, in this example, the output channel 20 has an output valve 24 for closing the output channel when it is not connected to the external device. Thus, the box 2 can maintain the vacuum condition when it is not connected to the evacuating device since the closure part 14 performs a vacuum tight seal to the container part 8 when the opening 12 is in a closed condition, and the valve 24 can be closed when the box is not connected to the evacuating device.

The channel system 18 comprises an input channel 26 connected to the inner space 10. The input channel 18 is connectable to an external feeding device for feeding gas to the inner space 10. The external feeding device can be part of the gas pressure unit. This is called venting (or feeding) of the box 2 in which the condition of the inner space 10 can be transformed from one pressure condition (e.g. about 1 Bar) into a condition with a higher gas pressure (e.g. 10 to 100 Bar). Preferably, the input channel 26 is provided with a particle filter 28 and an input valve 30 for closing the input channel 26 when it is not connected to the external feeding device. Generally, the transport box 2 will be vented with clean gas, but even if there are contamination particles in that gas, then the filter 28 can prevent these particles to enter the inner space 10.

Figure 5A:
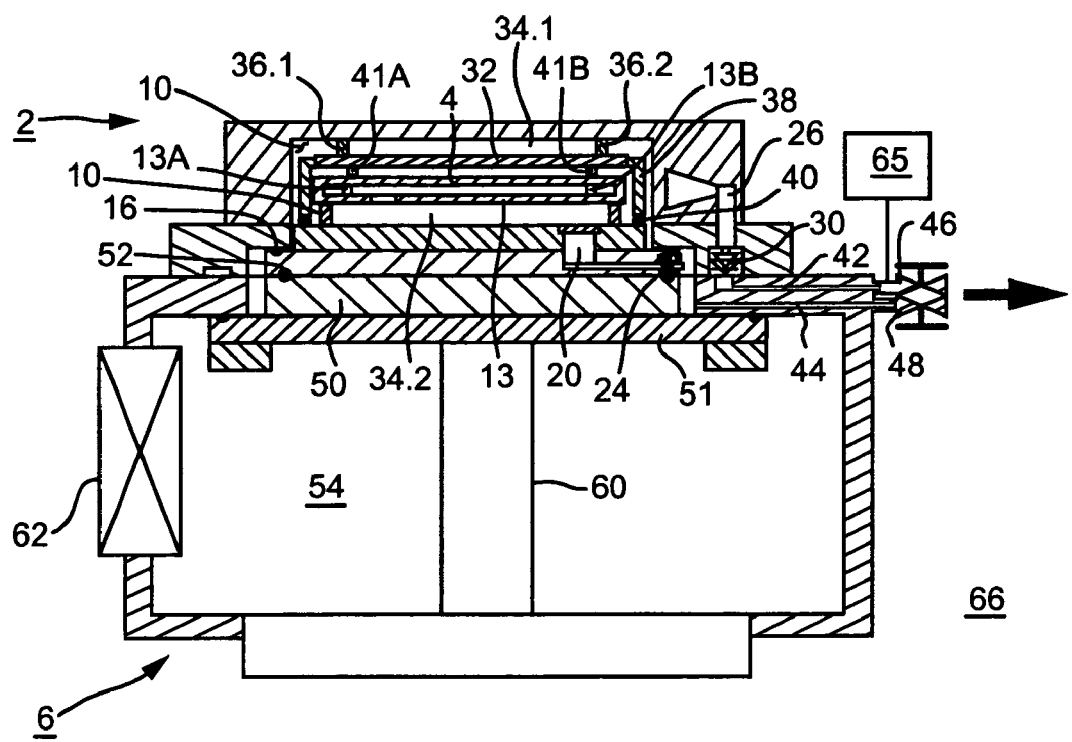
FIG. 5A is a schematic side view of a vertical oriented cross section of a system comprising the box according to FIG. 3A coupled with the load lock according to FIG. 4A, depicted in a situation wherein the box is being evacuated.

As depicted in FIG. 5A, the inner space 10 of the transport box 2 is provided with a separation member 32, which in this example, comprises a gas permeable cover sheet. The gas permeable cover sheet is arranged to be able to filter out particles with dimensions greater than 50 nm (note that sheets which can filter out all particle with larger dimensions than 20–50 nm can also be applied). The separation member 32 defines a first compartment 34.1 and a second compartment 34.2 in the inner space 10 of the box 2 when the box 2 is in closed condition. The separation member 32 provides protection for the patterning device 4 when placed in the storage position in the second compartment 34.2 against possible contamination in the first compartment 34.1. The gas permeable cover sheet can offer protection against contamination particles/molecules which unfortunately have entered into the first compartment 34.1 (contamination particles which, for example, have passed the vacuum seal 16). The permeable cover sheet 32 is mounted to the ceiling of the container 8 via connection members 36.1, 36.2.

Furthermore, the separation member 32 is attached to an inner wall part 38, which presses against the closure part 14 via a resilient seal 40. The seal 40 generally will not have to withstand large pressure differences (large is in the order of magnitude about 1 Bar) such that it is advantageously to apply a hollow O-formed (in cross section) or a V-shaped (in cross section) (low stiffness) seal which offers a good shield against contamination particles. The separation member 32, the wall part 38, and the seal 40 form a particle tight separation within the inner space 10 yielding the compartments 34.1 and 34.2. Attached to the separation member 32 are distance keepers 41A, 41B, which maintain a distance between the sheet 32 and the patterning device 4 by pressing the patterning device 4 on the carrying pins 13A, 13B for preventing the patterning device 4 from rattling during transport.

As shown in FIG. 5A, the channel system 18 is arranged such that the input channel 26 flows into the first compartment 34.1 and the output channel 20 flows out from the second department 34.2. Furthermore, the separation member 32 is oriented substantially horizontal such that the first compartment 34.1 is located above the second compartment 34.2. As explained in more detail below, such a configuration offers a favorable direction of the gas flow, both during evacuating and venting, from the upper part of the inner space 10, through the permeable sheet of the separation member 32, towards the bottom part of the inner space 10. The permeable sheet yields a relatively smooth gas flow, wherein it is mentioned that this is advantageous since the smoother the gas flow the smaller the risk of knocked loose contamination particles which can contaminate the patterning device 4.

The invention also relates to a load lock 6 (see FIG. 4A) that cooperates with the transport box 2, in accordance with an embodiment of the present invention. The load lock 6 can be part of an apparatus, such as a lithographic apparatus, a patterning device stocking apparatus, a contamination-particle-scanner, a cleaning unit, etc. The load lock 6 is arranged to be coupled to the transport box 2 such that the channel system 18 of the box 2 is connected to a channel system of the load lock 6. The coupling of the channel systems is such that the respective input channel 26 and output channel 20 of the transport box 2 are coupled to a respective first channel 42 and second channel 44 of the channel system of the load lock 6 (see FIG. 5A). The respective first and second channels 42, 44 are preferably provided with a respective first valve 46 and second valve 48.

During the coupling of the transport box 2 with the load lock 6, the closure part 14 is coupled to a closure member 50 for closing an opening 51 of the load lock 6. The outer part of the closure member 50 can be provided with a gastight seal 52 which, after coupling, defines a space between the closure part 14 and the closure member 50. In one embodiment, gas present in this space is evacuated such that a very thorough coupling is established. Preferably, a mechanical coupling is also performed which secures that the closure part 14 and the closure member 50 so that they are kept pressed against each other even when these are brought in a pressurized environment such as the inner part 54 of the load lock 6. The cooperation between the transport box 2 and the load lock 6 is explained into more detail hereinafter.

Figure 5B:
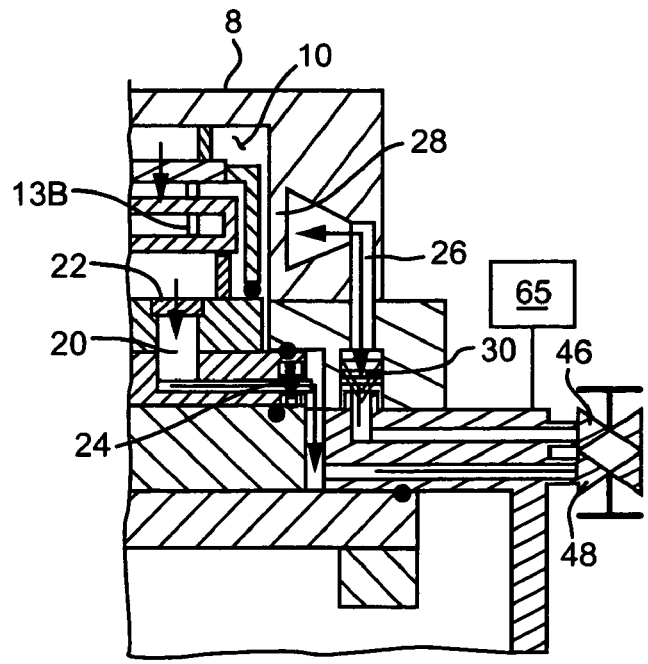
FIG. 5B is a detailed view of a portion of FIG. 5A.
Figure 6:
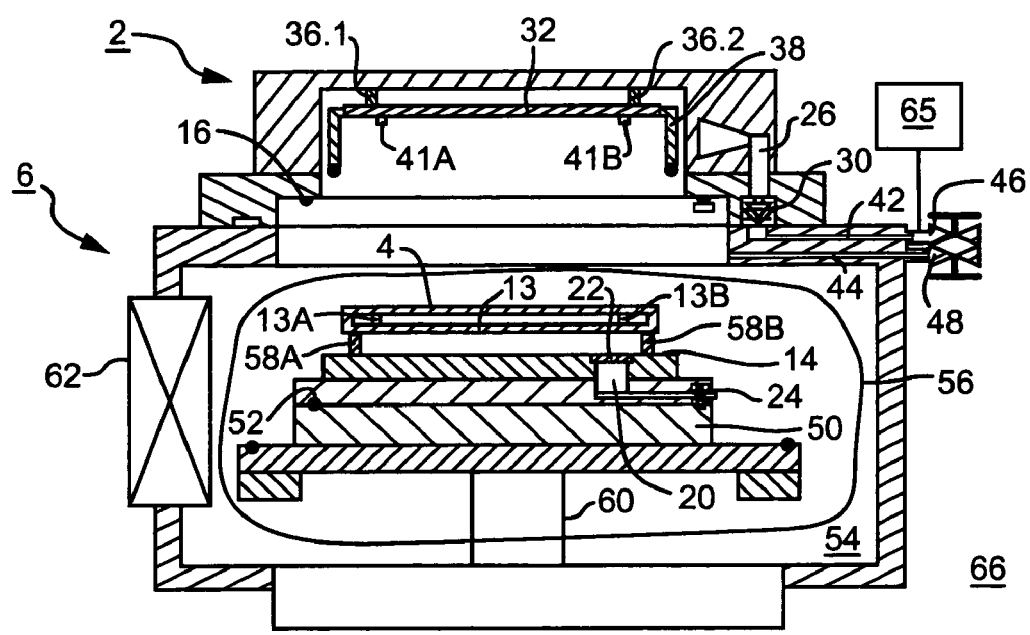
FIG. 6 is a schematic side view of the system according to FIG. 5A, depicted in a situation wherein the patterning device are transferred from the box into the load lock.

FIG. 6 illustrates the situation where, after the coupling of the transport box 2 to the load lock 6, the ensemble 56 including the patterning device 4, the table 13, carrying elements 58A, 58B, the closure part 14, and the closure member 50 are lowered into the inner space 54 of the load lock 6. The lowering of the ensemble 56 is performed by an elevator mechanism 60, which is part of a transfer assembly and which is schematically indicated in FIG. 5. In EUV applications, the inner space 54 is generally kept in a vacuum condition, while in other applications, the inner space 54 may be at a pressure of about 1 Bar.

The load lock 6 is provided with placing equipment 62, which comprises a gripper arm 64 (see FIG. 7), that transports the table 13 with the patterning device 4 from the load lock inner space 54 to an exposure unit of the lithographic apparatus 1 (e.g., located within the further inner space 7). During transportation, the gripper arm 64 can move under the table 13 and lift the table with the patterning device 4 from the carrying elements 58A, 58B.

The load lock 6 can be provided with an additional vacuum lock (transfer passage) through which the table 13 with the patterning device 4 are fed during the transportation between the inner part 54 and the exposure unit. After being used in the exposure unit, the placing equipment can transport the table 13 with the patterning device 4 back on the carrying elements 58A, 58B.

Figure 8A:
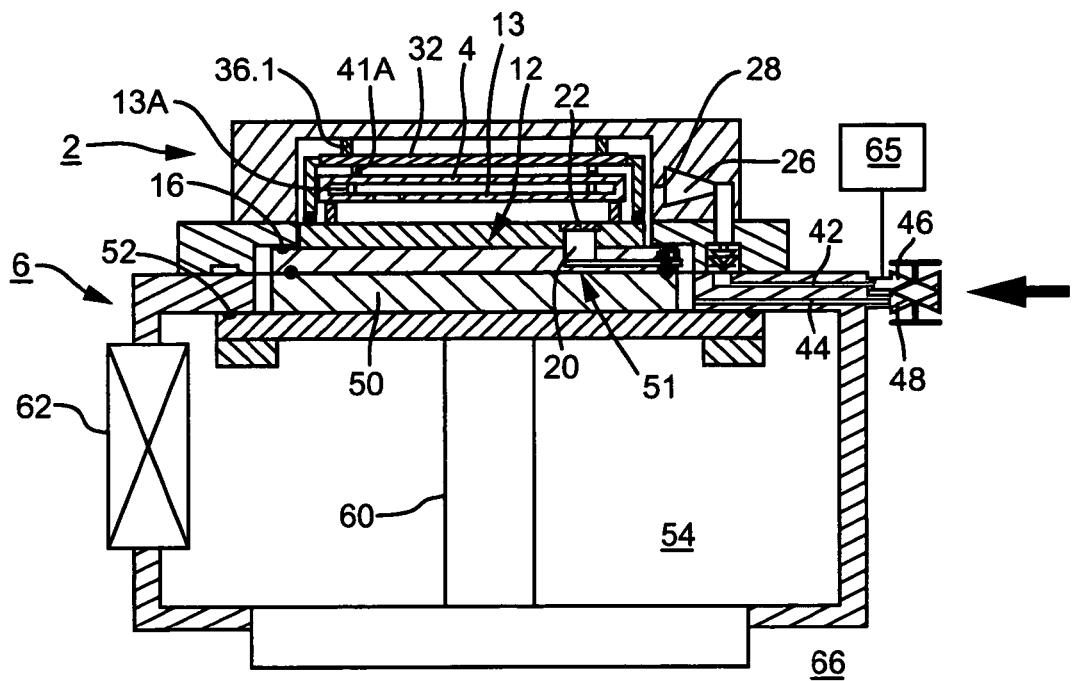
FIG. 8A is a schematic side view of the system according to FIG. 5A, depicted in a situation wherein a patterning device has been fed via the load lock into the box and the box is being vented.

FIG. 8A schematically depicts a situation where the elevator mechanism 60 has lifted the ensemble 56 such that the opening 12 of the box 2 and the opening 51 of the load lock are closed and the patterning devices 2 are transferred into the transport box 2.

The load lock 6 may be provided with a control system 65 for controlling the first valve 46, the second valve 48, an evacuating device coupled to the first channel 42 and a feeding device coupled to the second channel 44, such that during the coupling, the box 2 can be evacuated by the evacuating device after opening the second valve 48 and/or vented by the feeding device after opening the first valve 46, as discussed under operation hereinafter in more detail. The control system 65 is arranged to control the valves and devices such that the gas flow during evacuating and during venting is in the direction from the first compartment 34.1 to the second compartment 34.

The transport box 2 and the load lock 6 can be provided with connection alignment means, including for example, mechanical notches and/or a combination of a magnet and magnet-detector for checking and assuring that the connection of the box 2 and the load lock 6 is performed such that they are in a pre-determined mutual position. In this way, a proper coupling can be assured in order to keep a good gastight seal of the inner spaces of the box 2 and the load lock 6 on the one hand and the external environment 66 on the other hand.

Furthermore, a check on the proper coupling is also important for safety reasons. For example, the elevator mechanism 60 or transfer assembly can be controlled by signals from the alignment means ensuring that it is only activated when the proper coupling has been established. This way, no unexpected movements of the elevator mechanism 60 are made if it is not connected properly to the box 2.

Hereinafter, the operation of the box 2 and the load lock 6 will be described based on the detailed constructional explanation, provided above.

The patterning device 4 can be placed in the inner space 10 during transportation of the box 2, wherein the inner space 10 can be filled with a suitable gas such as nitrogen or argon. Patterning devices 4 are usually transported under atmospheric pressure condition (e.g. about 1 Bar) in the inner space 10 of the box 2. However, the inner space can be put under an overpressure (for example under 100 Bar) during transport, so that the chances that contaminating particles enter the inner space 10 from the external environment 66 is reduced by the overpressure.

After transportation, the patterning devices 4 are transferred from the transport box 2 to the load lock 6 according to:

coupling the transport box 2 with the load lock 6 (see FIG. 5A);
altering a pressure of the inner space 10 of the box 2 until a first gas pressure (e.g. an absolute pressure greater than 1 [Bar]) is obtained (see FIG. 5B);
creating the transfer opening between the inner space 10 of the box 2 and the inner space 54 of the load lock (connecting the inner spaces), wherein inner space 54 is already under a second gas pressure (for example under an absolute gas pressure of about 1 [Bar]), which is lower than the first gas pressure; and
transferring patterning device 4 from the inner space 10 through the patterning device transfer opening into the inner space 54 (see FIG. 6).

It is possible to pressurize the box before the coupling. However, it may be preferred to pressurize the box when the box is coupled to the load lock, since then pressurizing can be performed via coupled channel systems connected to a gas pressure unit located at the load lock.

Figure 4B:
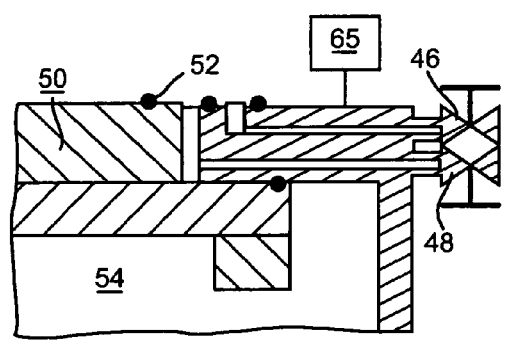
FIG. 4B is a detailed view of a portion of FIG. 4A.
Figure 4A:
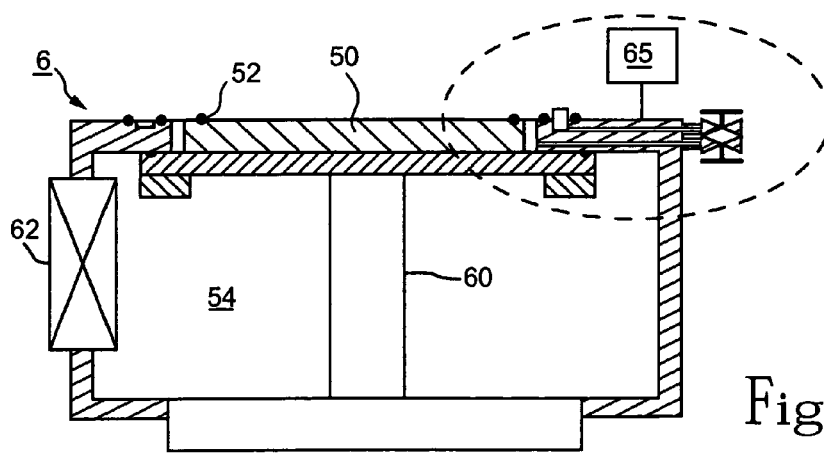
FIG. 4A is a schematic side view of a vertical oriented cross section of a load lock according to the invention.

During the coupling of the box 2 with the load lock 6 (FIG. 5A), the input channel 26 may be coupled to the first channel 42 closed by the first valve 46, and the output channel 20 may be coupled with the second channel 44 closed by the second valve 48. During the coupling, the load lock 6 automatically opens the input valve 30 and the output valve 24. As shown in FIG. 4A, the first and second channels 42, 44 are part of the load lock 6. After the coupling, the first channel 42 is closed by the first valve 46, and the second channel 44 is closed by the second valve 48.

During the coupling, a locking and pressing mechanism (e.g., a rotatable pin with a protrusion connected to a spring, wherein the pin can be rotated in order to lock the closure parts together under the pressing force of the spring) can be applied for securing a thorough connection of the closure part 14, the closure member 50, and the seal 52 even under pressurized conditions.

Figure 8B:
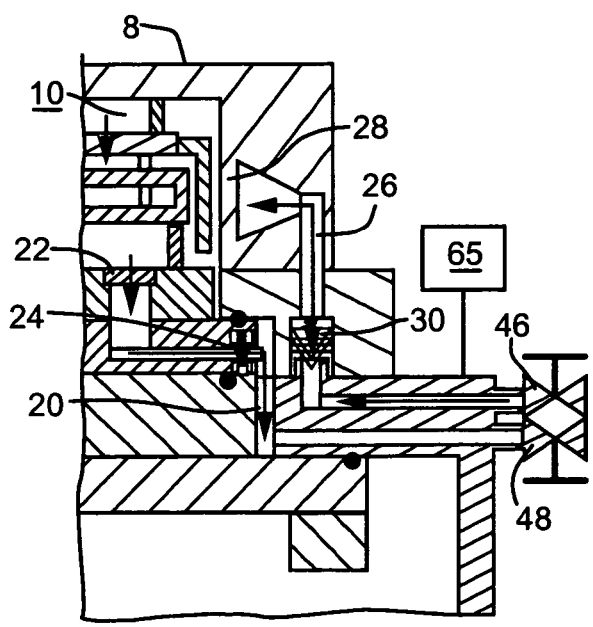
FIG. 8B is a detailed view of a portion of FIG. 8A.

For the pressure altering, the first valve 46 may be opened to supply suitable gas to the first channel 42, through the input channel 26, into the inner space 10. In this way, the box is filled with gas (for example under a pressure greater than atmospheric, see FIG. 8B). Since the input channel 26 is provided with the gas filter 28, possible contamination particles present in the gas will be filtered out. Preferably, however, the channel 42 is connected to a clean gas supply device of a gas pressure unit such that clean, particle free, gas is supplied through the channels 42, 26. During this process, the gas flow is as indicated with the arrows in FIG. 8A. Note that the load lock 6 maintains the second pressure condition in its inner space 54.

Alternately or additionally (e.g. at a later time), for the pressure altering, the second valve 48 may be opened to allow evacuation of gasses from the box 2 (for an application in which a pressure of the box is reduced before the opening). In one embodiment, the load lock 6 is provided with a reservoir for evacuated gas (from which the gas may be recovered) that may be connected to the second channel 44. Alternately, the gas may be vented to the outside atmosphere. The direction of the gas flow follows the arrows indicated in FIG. 5B. This gas flow is directed from the first compartment 34.1 to the second compartment 34.2. The patterning device 4 may contain a pattern on a side (bottom side) which faces the table 13, such that the direction of the gas flow is directed away from the pattern which is favorable since the chance of contamination is thereby optimally reduced. After evacuating the box 2, the valve 48 is closed.

After the coupling and the pressure altering, the patterning device 4 and the table 13 are transferred into the load lock 6. This is performed by lowering the ensemble 56 by means of the elevator 60, wherein a patterning device transfer opening is created between the inner space 10 and the inner space 54 through which the patterning device are fed. The inner spaces 10 and 54 are now connected via the patterning device transfer opening. It is noted that the connected or combined inner spaces may be gastight sealed from external environment 66 (see FIG. 6).

Figure 7:
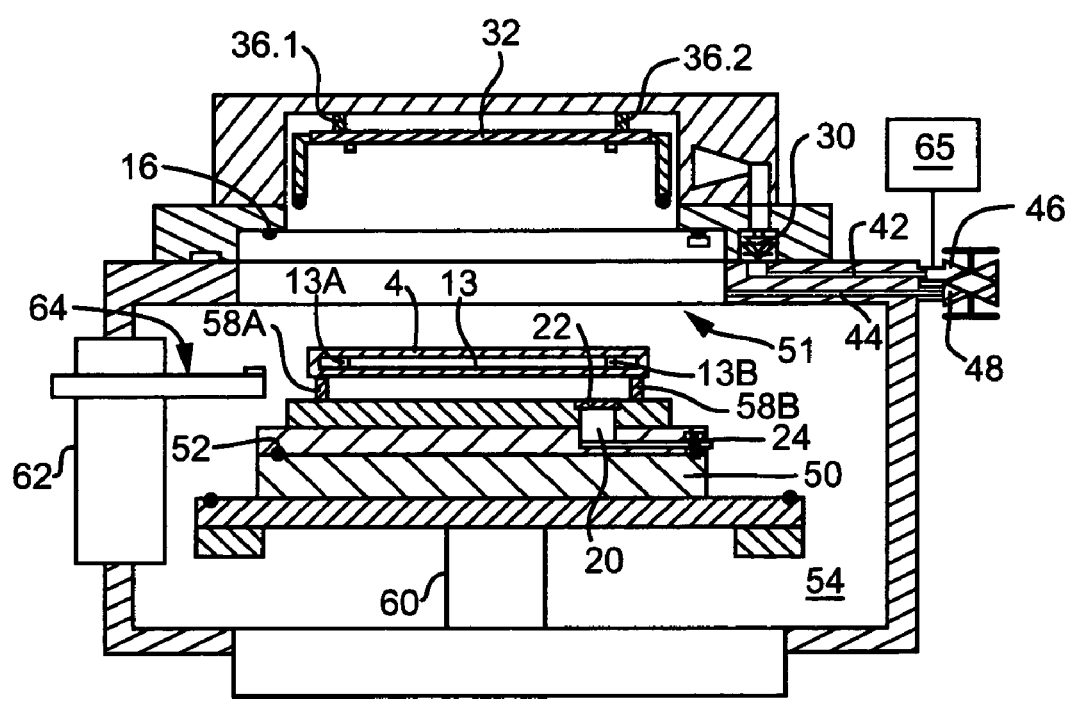
FIG. 7 is a schematic side view of the system according to FIG. 5A, depicted in a situation wherein the patterning device are exchanged between the system and an lithographic exposure unit coupled to the system.

In the situation of FIG. 7 the patterning device 4 have been transferred into the load lock 6. The placing equipment 62 can transport the patterning device 4 from the load lock 6 to the exposure unit. After usage, the patterning device are returned by the placing equipment 62 and placed, together with the table 13, on the carrying elements 58A, 58B (FIG. 7). Next, the elevator mechanism 60 rises the ensemble 56 until both the box and the load lock are closed (FIG. 8A).

In one arrangement, a box for transporting a lithographic patterning device is presented, the box being arranged to cooperate with a lithographic apparatus for the transfer of the patterning device, the box comprises a container part having an inner space with a storing position to store the patterning device and an opening for transferring the patterning device; a closure part for closing the opening; and a channel system configured to evacuate gases from/to the inner space of the box and/or to feed gases to/from the inner space of the box.

The patterning device transport box may be provided with a vacuum seal between the container part and the closure part for providing an essentially gas tight closing by the closure part. Accordingly, an evacuating device can be connected to the channel system of the box such that it can be pumped vacuum (if the opening is closed by the closure part) before the inner spaces of the lithographic apparatus and the box are connected.

In such an arrangement, during the connection, the gas flow between the inner spaces is zero or at least minimal. In addition, since the vacuum condition of the inner space of the lithographic apparatus is hardly influenced during the connection, there is no loss of time in regaining the vacuum condition such that the throughput of the apparatus is optimal.

For specific lithographic applications, such as Extreme UltraViolet (EUV) lithographic exposure processes, vacuum conditions are required (e.g. because air absorbs radiation at such wavelengths). In these applications, however, because the inner space of the box is generally under atmospheric pressure (about 1 bar) during the exchange of the patterning device, gas from the box enters the lithographic apparatus when the elevator mechanism or transfer assembly lowers the patterning device. It may then be advantageous to use a load lock in a vacuum condition which can form part of the lithographic apparatus. The patterning device can be transferred from the evacuated box into the load lock without bringing gas into the inner space of the load lock. The result is that the inner space of the load lock remains essentially vacuum such that no serious time delay is introduced in regaining the vacuum condition of the load lock.

The patterning device may be transferred from the box, via the load lock, into a further vacuum inner space of the lithographic apparatus (where a reticle stage can be located). In case of EUV applications the further inner space of the lithographic apparatus is in a vacuum condition. Transportation from the load lock to the reticle stage in the lithographic apparatus can be performed without the necessity of overcoming large pressure differences which would otherwise cause relatively large time delays. Consequently, the throughput of the lithographic apparatus is optimized.

The channel system may comprise an output channel for evacuating gasses from the box. The output channel can be provided with an output valve for closing the channel (for example when no evacuating device is connected to the channel). In another arrangement, the output channel is provided with a contamination filter in order to prevent contamination particles to enter the inner space of the box.

The channel system may also comprise an input channel connecting the inner space with for example an external feeding (venting) device for feeding (venting) gas to the inner space. In principle the input and output channel can be combined.

The input channel may be provided with an input valve for closing the input channel. The input channel yields the possibility of bringing the inner space of the box under a certain overpressure, wherein the input channel is closed by the input valve. For example, during transport of patterning device in the inner space of the box the inner space can be kept under overpressure with a suitable gas, and, just before transferring the patterning device into the lithographic apparatus, the inner space can be evacuated to obtain a vacuum condition in the box. It may be advantageous if the input channel is separated from the output channel such that it is possible to achieve the same gas flow direction for both evacuating and venting (see description in relation to same direction of gas flow directed away from the pattern on the patterning device both during evacuating and during feeding gasses) and if the input channel is provided with a particle filter.

The inner space of the box may be provided with a separation member including a gas permeable sheet, which separation member defines a first and a second compartment in the inner space of the box in closed condition, wherein the separation member provides protection for the patterning device when placed in the position in the second compartment against possible contamination from the first compartment. The separation member can be fixed to the inner walls of the box.

The channel system may be arranged such that an input channel of the channel system flows into the first compartment, and the output channel flows out from the second department. Then, the direction of the gas flow during evacuating is the same as the direction of the gas flow during venting such and the chance of particle contamination introduced by the gas flow is less than in cases where the directions are different during evacuating and venting.

Mostly, EUV patterning devices are clamped in the box against a reticle holder, wherein the side of the patterning device with the pattern is facing downwards. The separation member can be oriented, in an embodiment of the invention, substantially horizontal defining the first compartment to be located above the second compartment. Then, the gas flow through the input channel into the box is directed from the upper side to the lower side of the box. Also, the gas flow through the output channel is directed from the upper side to the lower side of the box, thus in the same direction as the gas flow via the input channel. This is an advantageous direction of the gas flow, since it is directed away from the pattern on the patterning device, thereby reducing the risk of swirling contamination particles in the second compartment contaminating the pattern of the patterning device is optimally reduced.

An additional advantage of the use of the separation member with the gas permeable sheet is that it yields a gentle gas flow during venting/evacuating through the box such that the chance on knocked loose contamination particles is minimal.

In another lithographic apparatus for cooperation with a patterning device transport box, the lithographic apparatus may be arranged to be coupled to the box such that a respective first and second channel of the lithographic apparatus are respectively connected to the input channel and the output channel, wherein the respective first and second channel are provided with a respective first and second valve. The lithographic apparatus can be arranged such that the input and output valves are automatically opened during the coupling of the box and the lithographic apparatus.

A lithographic apparatus may be provided with a control system for controlling the first valve, the second valve, a feeding device coupled to the first channel and an evacuating device coupled to the second channel, such that during the coupling the box can be evacuated by the evacuating device after opening the second valve and/or vented by the feeding device after opening the first valve. Herewith, the control system can be arranged to control the valves and devices such that the gas flow during evacuating and during venting is in the direction from the first compartment to the second compartment.

A lithographic apparatus may have a load lock provided with the said channel system of the lithographic apparatus, such that the load lock is arranged for cooperation with the box.

In yet another arrangement, there is provided a method for transferring patterning device from a box to a lithographic apparatus comprising evacuating gas from an essentially gas tight sealed inner space of the transport box loaded with the patterning device, for obtaining a first vacuum condition in the inner space; providing an inner space of the lithographic apparatus in a second vacuum condition; connecting the inner space of the box via a patterning device transfer opening with the inner space of the lithographic apparatus, wherein the connected inner spaces are essentially gas tight sealed from an external environment; and transferring the patterning device from the inner space of the box through the patterning device transfer opening to the inner space of the lithographic apparatus.

In an embodiment of the invention, there is provided a method of transferring a patterning device, from a storage or transport box to a lithographic apparatus, that substantially reduces the risk of contaminating the patterning device during the transfer. Generally, when a patterning device is transferred from an inner space of a storage box to an inner space of a lithographic apparatus that operates under atmospheric pressure (i.e. about 1 bar), particles present inside the lithographic apparatus may be deposited on the patterning device. This situation generally occurs if the inner space of the storage box has a pressure substantially equal to or lower than that of the inner space of the lithographic apparatus.

In an embodiment of the invention, the inner space of the storage box is pressurized so that the gas pressure of the inner space of the storage box is greater than the gas pressure of the inner space of the lithographic apparatus. In that way, the flow of contaminating particles entering the storage box maybe be stopped. In a further embodiment, pressure or gas flow may be directed to blow away particles that may initially be present inside the storage box or on the surfaces of the patterning device.

In an embodiment of the invention, the inner space of the storage box may be pressurized with air or with a gas or mixture that is substantially the same in content as an atmosphere residing inside the inner space of the lithographic apparatus. Examples of suitable gases that may be used to pressurize the inner space of the storage box include argon and/or another noble gas, nitrogen and/or another substantially nonreactive gas, and the like.

It will be appreciated that the inner space of the storage box may be pressurized prior to or subsequent to placing the storage box on the lithographic apparatus. In the latter situation, the inner space of the storage box is pressurized after placing the storage box on the lithographic apparatus. In such a case, the inner space may be kept under atmospheric pressure during transport of the storage box to the lithographic apparatus. In the former situation, the inner space of the lithographic apparatus is pressurized at a remote location and the pressurized storage box is transported to the lithographic apparatus. In such a case, the possibility that contaminating particles enter the inner space of the storage box may be reduced. In an embodiment of the invention, the initial pressure of the inner space of the box can be greater than 10 bars. In another embodiment of the invention, the initial pressure is about 100 bars.

It will also be appreciated that the pressure of the inner space of the box during transport may differ from the pressure of the inner space of the box during transfer of the patterning device. In an embodiment of the invention, the transport pressure of the inner space may be greater than the transfer pressure to limit contamination of the patterning device during transport of the box to the lithographic apparatus. Then, once the box is placed on the lithographic apparatus, the transport pressure may be reduced to reach a desired transfer pressure, which is greater than the pressure of the inner space of the lithographic apparatus, i.e. about 1 bar. Such a pressure reduction may be performed, for example, to avoid excessive outflow of gas into the inner space of the lithographic apparatus during transfer.

Figure 9:
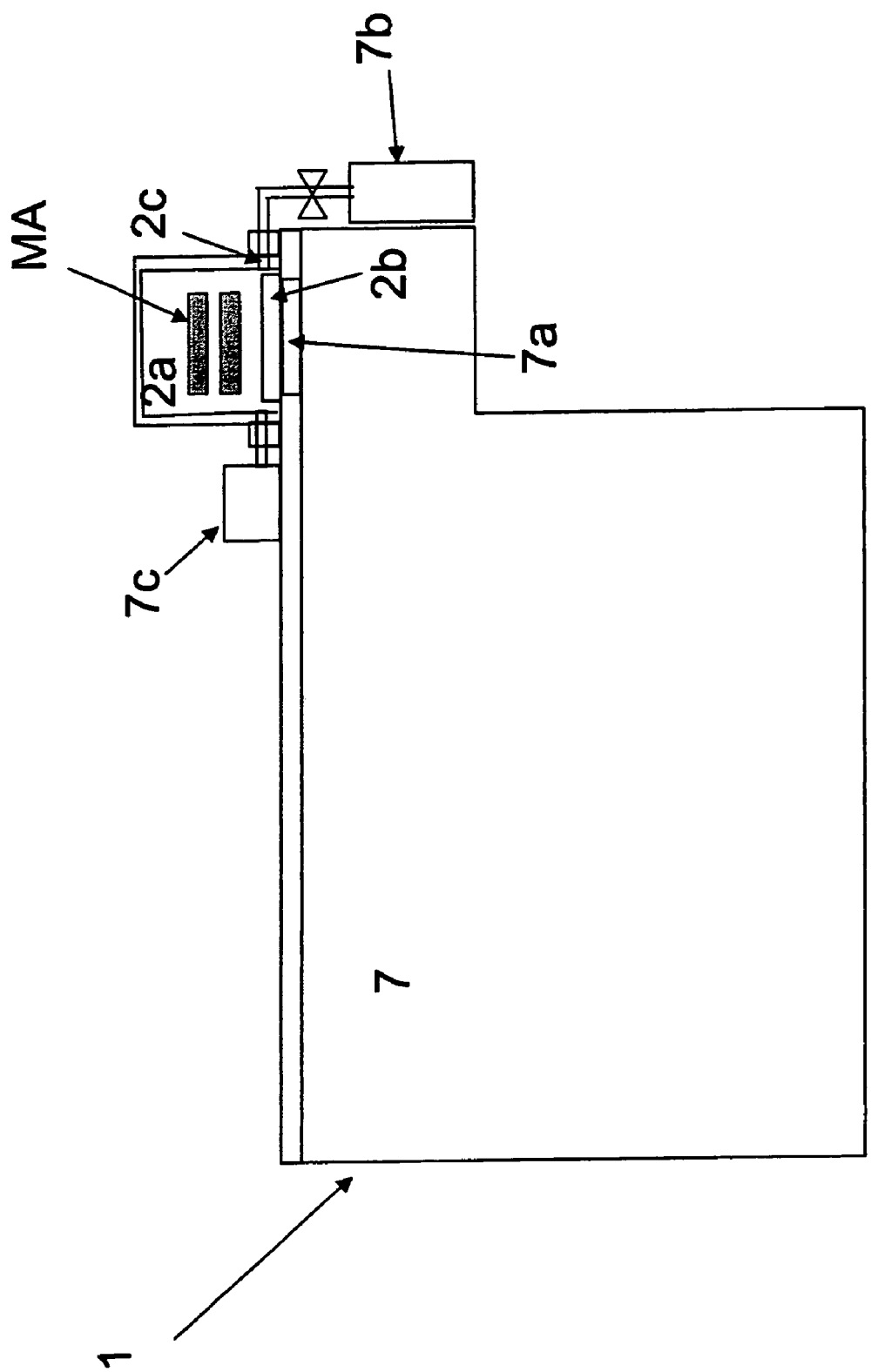
FIG. 9 represents a schematic representation of a lithographic apparatus and a mask storage box according to an embodiment of the invention.

FIG. 9 represents a schematic representation of a lithographic apparatus and a mask storage box according to an embodiment of the invention. The pressure of the inner space 7a of the lithographic apparatus is about 1 bar (i.e. the lithographic apparatus is under atmospheric pressure). In this embodiment of the invention, the apparatus is configured to pressurize the inner space of the storage box once the storage box is placed on the lithographic apparatus.

As can be seen in FIG. 9, lithographic apparatus 1 includes an inner space 7 and an openable wall part 7a through which a patterning device MA, located in a storage box 2, can be transferred. Storage box 2 includes an inner space 2a and an openable cover part 2b, and is placed on lithographic apparatus 1 such that openable cover part 2b overlaps openable wall part 7a of lithographic apparatus 1. In order to transfer the patterning device MA from the inner space 2a to the inner space 7 of the lithographic apparatus 1, the openable cover part 2b is opened in conjunction with the openable wall part 7a.

In the embodiment of the invention represented in FIG. 9, lithographic apparatus 1 includes a pressurizing unit 7b configured to pressurize the inner space 2a once the storage box 2 is placed on the apparatus. Lithographic apparatus 1 also includes a sensor unit 7c configured to detect an initial (i.e. pre-transfer) pressure of the inner space of the box. Storage box 2 may be provided with a channel system configured to introduce gas into, or evacuate gas from, inner space 2a. In particular, the channel system may include an input channel 2c connected to the inner space 2a and connectable to the pressurizing unit 7b. Although the pressurizing unit 7b has been depicted in FIG. 9 as being part of lithographic apparatus 1, it will be appreciated that the pressurizing unit 7b may be located at a remote distance from the lithographic apparatus 1.

In operation, once storage box 2 is placed on the lithographic apparatus, the sensor unit 7c detects the initial pressure of the inner space 2a and the pressurizing unit 7b is activated to pressurize the inner space 2a to a desired gas pressure (e.g. as measured by sensor unit 7c). In case the initial pressure detected by the sensor unit is greater than a desired pressure, the pressurizing unit 7b reduces the pressure of the inner space 2a. Then, once the desired gas pressure is attained, the openable cover part 2b is opened in conjunction with openable wall part 7a and the patterning device MA is transferred from the storage box 2 to the lithographic apparatus 1. Although the sensor unit 7c has been depicted in FIG. 9 as being part of lithographic apparatus 1, it will be appreciated that the sensor unit 7c may be part of storage box 2. In an embodiment of the invention, the sensor unit 7c, which is arranged on the storage box 2, is connected to the pressurizing unit 7b once the storage box is placed on the lithographic apparatus 1.

It will be appreciated that the different acts involved in transferring the patterning device from the inner space 2a of the box to the inner space 7 of the apparatus may be executed according to machine executable instructions. These machine executable instructions may be embedded in a data storage medium, e.g. of a control unit of the lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc.

The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5–20 nm), as well as particle beams, such as ion beams or electron beams.

The support structure supports, i.e., bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. As such, the description is not intended to limit the invention. The configuration, operation, and behavior of the embodiments presented herein have been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A method of transferring a patterning device from a box to a lithographic apparatus, said method comprising:
    pressurizing an inner space of the box in which the patterning device is located to obtain a first gas pressure in the inner space;
    subsequent to said pressurizing, opening the inner space of the box to an inner space of the lithographic apparatus, the inner space of the lithographic apparatus being under a second gas pressure of about 1 bar; and
    transferring the patterning device from the inner space of the box to the inner space of the lithographic apparatus, wherein the first gas pressure is greater than the second gas pressure.

2. The method of transferring according to claim 1, wherein said transferring is performed subsequent to said opening.

3. The method of transferring according to claim 1, said method comprising placing an openable cover part of the box on an openable wall part of the lithographic apparatus such that the openable cover part of the box overlaps the openable wall part of the lithographic apparatus,
    wherein said opening the inner space comprises opening the openable cover part and the openable wall part.

4. The method of transferring according to claim 1, wherein said method includes, prior to said pressurizing, placing an openable cover part of the box on an openable wall part of the lithographic apparatus such that the openable cover part of the box overlaps the openable wall part of the lithographic apparatus, and
    wherein said opening the inner space includes opening the openable cover part and the openable wall part.

5. The method of transferring according to claim 4, wherein said pressurizing includes, prior to said opening the inner space, reducing a pressure of the inner space in which the patterning device is located to obtain the first gas pressure.

6. The method of transferring according to claim 5, wherein said reducing includes evacuating gas from the inner space of the box through a channel provided with a filter and with a valve for closing the channel.

7. The method of transferring according to claim 5, wherein a pressure of the inner space prior to said reducing is greater than 10 bars.

8. The method of transferring according to claim 5, wherein a pressure of the inner space prior to said reducing is within an order of magnitude of 10 bars.

9. The method of transferring according to claim 4, wherein said method comprises, subsequent to said placing and prior to said pressurizing, detecting a pressure of the inner space of the box.

10. The method of transferring according to claim 4, wherein said pressurizing includes connecting the inner space of the box to an external feeding device.

11. The method of transferring according to claim 1, wherein, prior to said pressurizing, a gas pressure of the inner space of said box is substantially equal to 1 bar.

12. The method of transferring according to claim 1, wherein the inner space of the box is pressurized with at least one of the group consisting of argon and nitrogen.

13. The method of transferring according to claim 1, wherein an atmosphere of the inner space of the box is substantially the same in content as an atmosphere of the inner space of the lithographic apparatus.

14. The method of transferring according to claim 1, wherein the inner space of said box is provided with a separation member comprising at least one of the group consisting of a filter and a gas-permeable sheet, the separation member defining a first and a second compartment within the inner space.

15. The method of transferring according to claim 14, wherein the separation member is configured to protect a patterning device placed in the second compartment from contamination from the first compartment.

16. A lithographic apparatus comprising:
   a support structure configured to support a patterning device, the patterning device being configured to impart a desired pattern to a beam of radiation;
   a substrate holder configured to hold a substrate;
   a projection system configured to project the patterned beam of radiation onto a target portion of the substrate;
   a transfer assembly configured to transfer the patterning device from an inner space of a box to an inner space of said lithographic apparatus, the inner space of the lithographic apparatus being under a gas pressure of about 1 bar, and
   a gas pressure unit configured to pressurize the inner space of the box to have a first gas pressure immediately prior to transferring the patterning device from the inner space of the box to the inner space of said lithographic apparatus,
   wherein said first gas pressure is greater than the gas pressure of the inner space of said lithographic apparatus.

17. The lithographic apparatus of claim 16, wherein said gas pressure unit includes a channel system configured to be coupled to the inner space of the box.

18. The lithographic apparatus of claim 16, wherein the box includes a channel, said channel being connected to the inner space of the box, configured for connection to an evacuating device, and provided with a filter and a valve for closing the channel.

19. The lithographic apparatus of claim 16, wherein said gas pressure unit is configured to reduce a pressure of the inner space of the box prior to a transfer of said patterning device from an inner space of a box to an inner space of said lithographic apparatus by said transfer assembly.

20. The lithographic apparatus of claim 19, wherein said first gas pressure is greater than 10 bars.

21. The lithographic apparatus of claim 19, wherein said first gas pressure is within an order of magnitude of 10 bars.

22. The lithographic apparatus of claim 16, wherein said pressure unit includes a pressure sensor configured to detect a pressure of the inner space of the box before pressurizing said inner space.

23. The lithographic apparatus of claim 16, wherein the inner space of the box is pressurized with at least one of the group consisting of argon and nitrogen.

24. The lithographic apparatus of claim 16, wherein an atmosphere of the inner space of the box is substantially the same in content as an atmosphere of the inner space of the lithographic apparatus.

25. The lithographic apparatus of claim 16, wherein the inner space of said box is provided with a separation member comprising at least one of the group consisting of a filter and a gas-permeable sheet, the separation member defining a first and a second compartment within the inner space.

26. The lithographic apparatus of claim 25, wherein the separation member is configured to provide protection against possible contamination in the first compartment when the patterning device is placed in the storage position located in the second compartment.

27. The lithographic apparatus of claim 16, wherein said transfer assembly includes an elevator mechanism.

28. A data storage medium encoded with machine-executable instructions, said instructions describing a method for transferring a patterning device from a box to a lithographic apparatus, said method comprising:
   pressurizing an inner space of the box in which the patterning device is located to obtain a first gas pressure in the inner space;
   subsequent to said pressurizing, opening the inner space of the box to an inner space of the lithographic apparatus, the inner space of the lithographic being under a second gas pressure of about 1 bar; and
   transferring the patterning device from the inner space of the box to the inner space of the lithographic apparatus,
   wherein the first gas pressure is greater than the second gas pressure.

29. The data storage medium according to claim 28, wherein the connected inner spaces are substantially gas-tight sealed from an external environment.

30. The data storage medium according to claim 28, wherein said transferring is performed subsequent to said opening.

31. The data storage medium according to claim 28, wherein the method comprises, prior to said pressurizing, placing an openable cover part of the box on an openable wall part of the lithographic apparatus such that the openable cover part of the box overlaps the openable wall part of the lithographic apparatus, and
   wherein said coupling includes opening the openable cover part and the openable wall part.

32. The data storage medium according to claim 28, wherein said pressurizing includes, prior to said opening, reducing a pressure of the inner space in which the patterning device is located to obtain the first gas pressure.

* * * * *